(12) United States Patent
Iwahashi et al.

(10) Patent No.: US 12,426,319 B2
(45) Date of Patent: Sep. 23, 2025

(54) SEMICONDUCTOR DEVICE AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yohei Iwahashi, Nisshin (JP); Jun Saito, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 459 days.

(21) Appl. No.: 17/977,420

(22) Filed: Oct. 31, 2022

(65) Prior Publication Data
US 2023/0143618 A1    May 11, 2023

(30) Foreign Application Priority Data
Nov. 9, 2021    (JP) .................................. 2021-182833

(51) Int. Cl.
| | | |
|---|---|---|
| H10D 62/10 | (2025.01) | |
| H01L 21/04 | (2006.01) | |
| H10D 12/01 | (2025.01) | |
| H10D 30/66 | (2025.01) | |
| H10D 62/17 | (2025.01) | |
| H10D 62/832 | (2025.01) | |

(52) U.S. Cl.
CPC .......... *H10D 62/111* (2025.01); *H01L 21/046* (2013.01); *H10D 12/031* (2025.01); *H10D 30/668* (2025.01); *H10D 62/393* (2025.01); *H10D 62/8325* (2025.01)

(58) Field of Classification Search
None
See application file for complete search history.

(56) References Cited

U.S. PATENT DOCUMENTS

| | | |
|---|---|---|
| 2018/0247999 A1 | 8/2018 | Arauchi et al. |
| 2020/0168732 A1 | 5/2020 | Mitani et al. |

(Continued)

FOREIGN PATENT DOCUMENTS

WO    WO-2019044921 A1 *   3/2019   ......... H01L 29/0619

*Primary Examiner* — Jack S Chen
(74) *Attorney, Agent, or Firm* — Posz Law Group, PLC

(57) ABSTRACT

In a semiconductor device, a first deep layer has a high-concentration region and a low-concentration region in a concentration profile of an impurity concentration along a depth direction. The high-concentration region has a high concentration peak at which an impurity concentration is maximum, and includes a region that is not depleted in an off state. The low-concentration region is closer to a high-concentration layer than the high-concentration region, has a region in which a gradient of change in impurity concentration is smaller than a predetermined value, and is depleted in the off state. A first length between a first position closest to a base layer in the first deep layer and a second position of the high concentration peak is shorter than a second length between the second position and a third position closest to the base layer in the low-concentration region.

3 Claims, 6 Drawing Sheets

(56) References Cited

U.S. PATENT DOCUMENTS

| | | |
|---|---|---|
| 2022/0246719 A1 | 8/2022 | Miyahara et al. |
| 2023/0143618 A1* | 5/2023 | Iwahashi ............ H10D 62/157 257/77 |

* cited by examiner

SEMICONDUCTOR DEVICE AND METHOD FOR MANUFACTURING THE SAME

CROSS REFERENCE TO RELATED APPLICATION

The present application claims the benefit of priority from Japanese Patent Application No. 2021-182833 filed on Nov. 9, 2021. The entire disclosures of the above application are incorporated herein by reference.

TECHNICAL FIELD

The present disclosure relates to a semiconductor device having a trench gate structure and a method for manufacturing the same.

BACKGROUND

For example, a semiconductor device having a semiconductor element such as a metal oxide semiconductor field effect transistor (MOSFET) is known. Such a semiconductor device may include a semiconductor substrate that has a drift layer, a base layer disposed adjacent to one surface of the semiconductor substrate, and a source region disposed in a surface layer portion of the base layer. The semiconductor substrate may have a trench penetrating the source region and the base layer. A gate insulating film and a gate electrode may be disposed in the trench, to thereby form a trench gate structure.

A drain region may be disposed adjacent to the other surface of the semiconductor substrate. An upper electrode may be disposed adjacent to the one surface of the semiconductor substrate so as to be electrically connected to the source region and the base layer. A lower electrode may be disposed adjacent to the other surface of the semiconductor substrate so as to be electrically connected to the drain region.

Further, a deep layer may be disposed in the drift layer at a position below the trench and is connected to the base layer while being separated from the trench.

SUMMARY

The present disclosure provides a semiconductor device. In an aspect of the present disclosure, the semiconductor device may include a first deep layer disposed below a trench of a trench gate structure in a drift layer, and separated from the trench. The first deep layer may have a high-concentration region and a low-concentration region in a concentration profile of an impurity concentration along a depth direction. The high-concentration region may have a high concentration peak at which an impurity concentration is maximum, and include a region that is not depleted in an off state. The low-concentration region may be disposed closer to a high-concentration layer than the high-concentration region, have a region in which a gradient of change in impurity concentration is smaller than a predetermined value, and be depleted in the off state. A first length between a first position closest to the base layer in the first deep layer and a second position of the high concentration peak may be shorter than a second length between the second position and a third position closest to the base layer in the low-concentration region.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
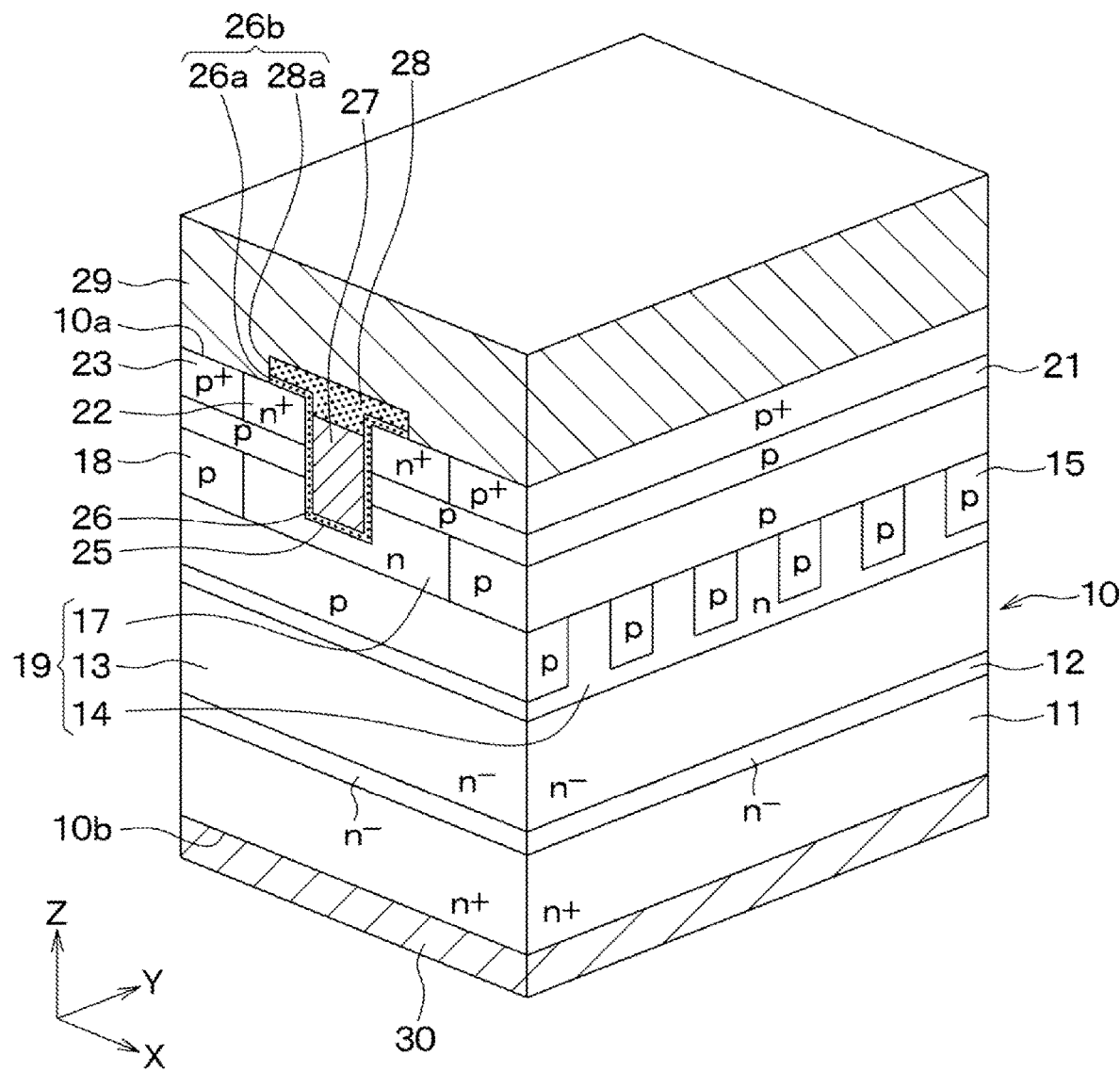
FIG. 1 is a perspective and cross-sectional view of a SiC semiconductor device according to a first embodiment.

To begin with, a relevant technology will be described only for understanding the embodiments of the present disclosure. For example, a semiconductor device having a semiconductor element such as a metal oxide semiconductor field effect transistor (MOSFET) is known. Such a semiconductor device may include a semiconductor substrate that has a drift layer, a base layer disposed adjacent to one surface of the semiconductor substrate, and a source region disposed in a surface layer portion of the base layer. The semiconductor substrate may have a trench penetrating the source region and the base layer. A gate insulating film and a gate electrode may be disposed in the trench, to thereby form a trench gate structure.

A drain region may be disposed adjacent to the other surface of the semiconductor substrate. An upper electrode may be disposed adjacent to the one surface of the semiconductor substrate so as to be electrically connected to the source region and the base layer. A lower electrode may be disposed adjacent to the other surface of the semiconductor substrate so as to be electrically connected to the drain region.

Further, a deep layer may be disposed in the drift layer at a position below the trench and connected to the base layer while being separated from the trench. In such a semiconductor device, breakage of the gate insulating film due to a depletion layer formed between the deep layer and the drift layer may be suppressed.

In such a semiconductor device, there is a demand to suppress a decrease in breakdown voltage while suppressing breakage of a gate insulating film, and to suppress an increase in size along a stacking direction of a drift layer and a base layer.

The present disclosure provides a semiconductor device and a method for manufacturing the semiconductor device, which are capable of suppressing the decrease in breakdown voltage while suppressing breakage of the gate insulating film, and suppressing an increase in size along the stacking direction of the drift layer and the base layer.

According to an aspect of the present disclosure, a semiconductor device includes: a drift layer of a first conductivity type; a base layer of a second conductivity type disposed on a surface layer portion of the drift layer; an impurity region of the first conductivity type disposed on a surface layer portion of the base layer, and having an impurity concentration higher than that of the drift layer; a trench gate structure including a gate insulating film disposed on a wall surface of a trench that penetrates the base layer and the impurity region and reaches the drift layer, and a gate electrode disposed on the gate insulating film; a first deep layer of the second conductivity type disposed below the trench in the drift layer, and separated from the trench; a second deep layer of the second conductivity type connecting the base layer and the first deep layer; a high-concentration layer of the first conductivity type or the second conductivity type disposed opposite to the base layer with respect to the drift layer, and having an impurity concentration higher than that of the drift layer; a first electrode electrically connected to the base layer and the impurity region; and a second electrode electrically connected to the high-concentration layer. The semiconductor device is configured to be in an on state so that a current occurs between the first electrode and the second electrode when the gate electrode is applied with a gate voltage being equal to or higher than a predetermined voltage, and to be in an off state when the gate electrode is applied with a gate voltage being lower than the predetermined voltage. The first deep layer has a high-concentration region and a low-concentration region in a concentration profile of an impurity concentration along a depth direction that corresponding to a stacking direction of the drift layer and the base layer. The high-concentration region has a high concentration peak at which the impurity concentration is maximum, and includes a region that is not depleted in the off state. The low-concentration region is disposed adjacent to the high-concentration layer than the high-concentration region, has a region in which a gradient of change in the impurity concentration is smaller than a predetermined value, and is depleted in the off state. A position closest to the base layer in the first deep layer is referred to as a first position. A position of the high concentration peak is referred to as a second position. A position closest to the base layer in the low-concentration region is referred to as a third position. The high-concentration region is disposed between the first position and the third position. Further, a first length between the first position and the second position is shorter than a second length between the second position and the third position.

In such a configuration, the first deep layer has the concentration profile including the high-concentration region and the low-concentration region. The high-concentration region has the high-concentration peak having the impurity concentration that does not cause depletion in the off state. The low-concentration region has the impurity concentration that causes depletion in the off state. Therefore, it is possible to suppress a decrease in breakdown voltage while suppressing breakage of the gate insulating film. Also, the first deep layer is configured such that the first distance is shorter than the second distance. Therefore, as compared to a case where the first distance is equal to or greater than the second distance in a semiconductor device having the same breakdown voltage, the length of the first deep layer in the stacking direction can be reduced. Accordingly, it is less likely that the semiconductor device will be increased in size in the stacking direction.

According to an aspect of the present disclosure, a method for manufacturing the semiconductor device of the above aspect includes: preparing a constituent substrate including a part of the drift layer adjacent to the high-concentration layer; forming the first deep layer by performing ion-implantation to the constituent substrate; and forming the drift layer having the first deep layer therein by epitaxially growing a constituent layer on the first deep layer.

In such a method, the first deep layer is formed to have the concentration profile having the high-concentration region having the high concentration peak with the impurity concentration that does not cause depletion in the off state, and the low-concentration region having the impurity concentration that causes depletion in the off state. As a result, the semiconductor device in which the decrease in breakdown voltage is suppressed while suppressing breakage of the gate insulating film can be manufactured. Also, the first deep layer is formed such that the first length is shorter than the second length. Therefore, the length of the first deep layer in the stacking direction can be shortened, as compared to the case where the first length is equal to or greater than the second length in the semiconductor device having the same breakdown voltage. Accordingly, it is possible to manufacture the semiconductor device that suppresses the increase in size in the stacking direction.

Hereinafter, embodiments of the present disclosure will be described with reference to the drawings. In the embodiments described hereinafter, the same or equivalent parts will be designated with the same reference numerals.

First Embodiment

A semiconductor device according to a first embodiment will be described with reference to the drawings. The semiconductor device of the present embodiment is, for example, mounted on a vehicle such as an automobile and used as a device for driving various electronic devices for the vehicle. As an example of the semiconductor device, a silicon carbide (hereinafter also referred to as SiC) semiconductor device in which an inverted MOSFET having a trench gate structure is formed will be described. In the present embodiment, a configuration of a cell region in which the MOSFET is formed will be described. However, the SiC semiconductor device actually has an outer peripheral region formed with a field limiting ring (FLR) structure of the like so as to surround the cell region.

Hereinafter, a direction along a surface of a substrate 11, that is, a direction along a planar direction of the substrate 11 is defined as an X-axis direction, and another direction along the planar direction of the substrate 11 and intersecting the X-axis direction is defined as Y-axis direction. Further, a direction orthogonal to both the X-axis direction and the Y-axis direction is defined as a Z-axis direction. In the present embodiment, the X-axis direction and the Y-axis direction are orthogonal to each other. The Z-axis direction in the present embodiment corresponds to a depth direction of a semiconductor substrate 10, which will be described later, and also corresponds to a stacking direction of a drift layer 19 and a base layer 21, which will be described later.

The SiC semiconductor device is constructed using a semiconductor substrate 10, as shown in FIG. 1. Specifically, the SiC semiconductor device includes an n+-type substrate 11 made of SiC. In the present embodiment, the substrate 11 has an off-angle of 0 to 8 degrees with respect to, for example, a (0001) Si plane. Also, the substrate 11 has an n-type impurity concentration of, for example, $1.0 \times 10^{19}/cm^3$, such as nitrogen or phosphorus, and has a thickness of about 300 micrometres (μm). The substrate 11 forms a drain region in the present embodiment, and corresponds to a high-concentration layer.

An n−-type buffer layer 12 made of SiC is disposed on a surface of the substrate 11. The buffer layer 12 is formed by epitaxial growth on the surface of the substrate 11. The buffer layer 12 has an n-type impurity concentration between the impurity concentration of the substrate 11 and the impurity concentration of a low-concentration layer 13, and has a thickness of about 1 μm.

The n−-type low-concentration layer 13 is disposed on a surface of the buffer layer 12. The low-concentration layer 13 is made of SiC, and has an n-type impurity concentration of, for example, $5.0 \times 10^{15}$ to $10.0 \times 10^{15}/cm^3$ and a thickness of about 10 μm to 15 μm. The low-concentration layer 13 may have a constant impurity concentration along the Z-axis direction. However, the low-concentration layer 13 preferably has a concentration distribution gradient so that the concentration is higher at a side closer to the substrate 11 than at a side further from the substrate 11. For example, in the low-concentration layer 13, a portion separated by about 3 μm to 5 μm from the surface of the substrate 11 may have an impurity concentration higher than that of another portion by about $2.0 \times 10^{15}/cm^3$. With the configuration described above, an internal resistance of the low-concentration layer 13 can be reduced, and an on-resistance can be reduced.

A JFET portion 14 and a first deep layer 15 are disposed on a surface layer portion of the low-concentration layer 13. In the present embodiment, the JFET portion 14 and the first deep layer 15 are extended along the X-axis direction, and have linear portions arranged alternately and repeatedly in the Y-axis direction. That is, the JFET portion 14 and the first deep layer 15 are laid out in stripes extending along the X-axis direction, and are alternately arranged in the Y-axis direction. In other words, the JFET portion 14 and the first deep layer 15 are arranged in stripes extending along the X-axis direction, and are alternately arranged in the Y-axis direction, in a plan view normal to the surface of the substrate 11, that is, when viewed along a direction normal to the surface of the substrate 11. The direction normal to the surface of the substrate 11 corresponds to the stacking direction of the drift layer 19 and the base layer 21, which will be described later.

The JFET portion 14 has an n-type impurity concentration higher than that of the low-concentration layer 13, and has a depth of 0.3 μm to 1.5 μm. In the present embodiment, the JFET portion 14 has an n-type impurity concentration of $7.0 \times 10^{16}$ to $5.0 \times 10^{17}/cm^3$. The impurity concentration of the first deep layer 15 will be specifically described later.

The first deep layer 15 of the present embodiment is shallower than the JFET portion 14. That is, the first deep layer 15 is formed such that the bottom portion of the first deep layer 15 is located inside the JFET portion 14. In other words, the first deep layer 15 is formed such that the JFET portion 14 is located between the first deep layer 15 and the low-concentration layer 13.

A current spreading layer 17, a second deep layer 18, a base layer 21, a source region 22, a contact region 23 and the like are formed on the JFET portion 14 and the first deep layer 15.

The conductivity type of the current spreading layer 17 is n-type, and the current spreading layer 17 is formed so as to connect to the JFET portion 14. In the present embodiment, therefore, the low-concentration layer 13, the JFET portion 14, and the current spreading layer 17 are connected to each other. The low-concentration layer 13, the JFET portion 14, and the current spreading layer 17 form a drift layer 19. The first deep layer 15 is disposed in the drift layer 19.

The conductivity type of the second deep layer 18 is p-type, and the second deep layer 18 has the same thickness as the current spreading layer 17. The second deep layer 18 is formed to connect to the first deep layer 15.

The current spreading layer 17 and the second deep layer 18 extend in a direction intersecting the longitudinal direction of the striped portions of the JFET portion 14 and the first deep layer 15. In the present embodiment, the current spreading layer 17 and the second deep layers 18 are laid out so that the current spreading layer 17 and the second deep layer 18 extend in the Y-axis direction as the longitudinal direction, and are arranged alternately in the X-axis direction. The formation pitch of the current spreading layer 17 and the second deep layer 18 corresponds to the formation pitch of a trench gate structure, which will be described later, and the second deep layer 18 is disposed to interpose each trench 25, which will be described later.

The conductivity type of the base layer 21 is p-type, and the base layer 21 is disposed on the current spreading layer 17 and the second deep layer 18. Therefore, the first deep layer 15 is connected to the base layer 21 via the second deep layer 18.

The conductivity type of the source region 22 is n+-type, and the source region 22 is disposed on a surface layer portion of the base layer 21. The conductivity type of the contact region 23 is p+ type, and the contact region 23 is disposed on the surface layer portion of the base layer 21. Specifically, the source region 22 is disposed to be in contact with a side surface of the trench 25, which will be described later, and the contact region 23 is disposed opposite to the trench 25 with respect to the source region 22. In the present embodiment, the source region 22 corresponds to an impurity region.

The base layer 21 has, for example, a p-type impurity concentration of $3.0 \times 10^{17}/cm^3$ or lower. The base layer 21 of the present embodiment is formed by, for example, ion implantation. The source region 22 has an n-type impurity concentration at the surface layer portion, that is, a surface concentration of $1.0 \times 10^{21}/cm^3$, for example. The contact region 23 has a p-type impurity concentration at the surface layer portion, that is, a surface concentration of $1.0 \times 10^{21}/cm^3$, for example.

In the present embodiment, as described above, the semiconductor substrate 10 is configured to include the substrate 11, the buffer layer 12, the low-concentration layer 13, the JFET portion 14, the first deep layer 15, the current spreading layer 17, the second deep layer 18, the base layer 21, and the source region 22, the contact region 23, and the like. Further, since the semiconductor substrate 10 is configured as described above, it can be said that the semiconductor substrate 10 is made of SiC. In the present embodiment, a first surface 10a of the semiconductor substrate 10 is provided by the source region 22 and the contact region 23, and a second surface 10b of the semiconductor substrate 10 opposite to the first surface 10a is provided by the substrate 11.

The semiconductor substrate 10 is formed with the trench 25 that penetrates the source region 22, the base layer 21 and the like, and reaches the current spreading layer 17 so that the bottom surface of the trench 25 is located within the current spreading layer 17. For example, the trench 25 has a width of, for example, 1.4 to 2.0 µm. The trench 25 is disposed not to reach the JFET portion 14 and the first deep layer 15. That is, the trench 25 is disposed so that the JFET portion 14 and the first deep layer 15 are located below the bottom surface and separated from the trench 25.

Although only one trench 25 is shown in FIG. 1, the semiconductor substrate 10 is actually formed with multiple trenches 25. The multiple trenches 25 are actually extended in the Y-axis direction and arranged at regular intervals in the X-axis direction into the stripe shape. That is, in the present embodiment, the trenches 25 are formed such that the longitudinal direction of the trenches 25 is orthogonal to the longitudinal direction of the first deep layer 15. Moreover, the trench 25 is formed so as to be located between the second deep layers 18, in the plan view along the stacking direction of the drift layer 19 and the base layer 21.

A gate insulating film 26 is disposed on an inner wall surface of the trench 25, and a gate electrode 27 made of doped-polysilicon is disposed on the gate insulating film 26. Accordingly, the trench gate structure is formed. Although not particularly limited, the gate insulating film 26 is formed by thermally oxidizing the inner wall surface of the trench 25 or by performing a chemical vapor deposition (CVD) method. The gate insulating film 26 has a thickness of about 100 nm on both the side wall and the bottom wall of the trench 25.

The gate insulating film 26 is formed also on a surface other than the inner wall surface of the trench 25. Specifically, the gate insulating film 26 is formed so as to also partially cover the first surface 10a of the semiconductor substrate 10. More specifically, the gate insulating film 26 is formed so as to also partially cover the surface of the source region 22. In other words, the gate insulating film 26 is formed with a contact hole 26a for exposing the source region 22 and the contact region 23 at a position different from the position where the gate electrode 27 is disposed.

An interlayer insulating film 28 is disposed on the first surface 10a of the semiconductor substrate 10 to cover the gate electrode 27, the gate insulating film 26, and the like. The interlayer insulating film 28 is made of borophosphosilicate glass (BPSG) or the like.

The interlayer insulating film 28 is formed with a contact hole 28a that is connected to the contact hole 26a and exposes the source region 22 and the contact region 23. The contact hole 28a of the interlayer insulating film 28 is connected to the contact hole 26a of the gate insulating film 26, and thus the contact hole 28a of the interlayer insulating film 28 functions as one contact hole together with the contact hole 26a of the gate insulating film 26. In the following, the contact hole 26a and the contact hole 28a are collectively referred to as a contact hole 26b. The contact hole 26b may have any pattern. For example, the contact hole 26b may have a pattern in which multiple square holes are arranged, a pattern in which rectangular linear holes are arranged, or a pattern in which linear holes are arranged. In the present embodiment, the contact hole 26b has a linear shape along the longitudinal direction of the trench 25.

An upper electrode 29 is disposed on the interlayer insulating film 28. The upper electrode 29 is electrically connected to the source region 22 and the contact region 23 through the contact hole 26b. In the present embodiment, the upper electrode 29 corresponds to a first electrode.

The upper electrode 29 of the present embodiment is made of multiple metals such as Ni and Al. A portion of the multiple metals that is in contact with a portion forming an n-type SiC (that is, the source region 22) is made of a metal capable of making ohmic contact with the n-type SiC. In addition, at least a portion of the multiple metals that is in contact with a portion forming a p-type SiC (that is, the base layer 21) is made of a metal capable of making ohmic contact with the p-type SiC.

A lower electrode 30 is disposed adjacent to the second surface 10b of the semiconductor substrate 10. The lower electrode 30 is electrically connected to the substrate 11. In the present embodiment, the lower electrode 30 corresponds to a second electrode.

In the SiC semiconductor device of the present embodiment, with such a structure, MOSFET of an n-channel type inverted trench gate structure is formed. In the present embodiment, the n-type, the $n^+$-type, and the $n^-$-type correspond to a first conductivity type, and the p-type and the $p^+$-type correspond to a second conductivity type.

In such a SiC semiconductor device, as will be described later in detail, when a gate voltage applied to the gate electrode 27 is equal to or higher than a threshold voltage of the insulated gate structure, a current is caused between the upper electrode 29 and the lower electrode 30, so that the SiC semiconductor device is in an on state. Moreover, when the gate voltage applied to the gate electrode 27 is lower than the threshold voltage, the current between the upper electrode 29 and the lower electrode 30 is cut off, so that the SiC semiconductor device is in an off state.

Next, a concentration profile along the Z-axis direction (that is, depth direction) of the first deep layer 15 of the present embodiment will be described with reference to FIG. 2. Hereinafter, an interface between the first deep layer 15 and the current spreading layer 17 will be also simply referred to as the interface. Also, in the semiconductor substrate 10, a position at the interface is defined as a first position P1. In other words, the interface between the first deep layer 15 and the current spreading layer 17 can be said a portion closest to the base layer 21 in the first deep layer 15.

Figure 2:
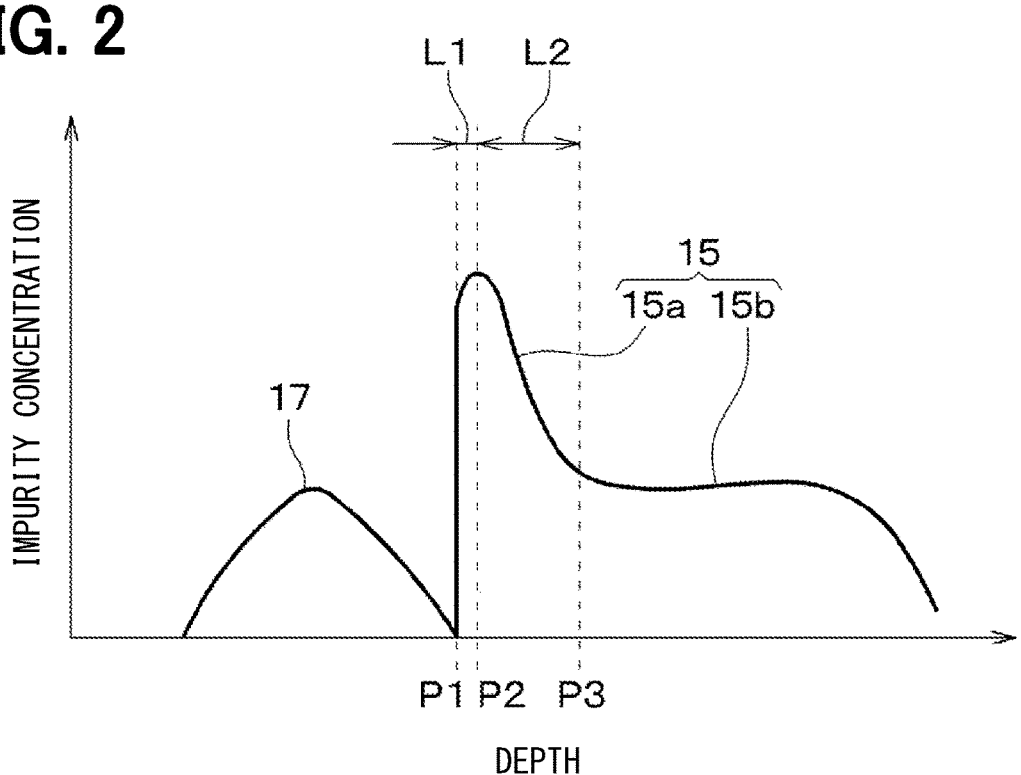
FIG. 2 is a schematic diagram showing a concentration profile of a current spreading layer and a first deep layer.

First, as shown in FIG. 2, the first deep layer 15 has a concentration profile having a high-concentration region 15a including a high concentration peak. The high-concentration region 15a has a maximum concentration on a side adjacent to the first position P1, which is adjacent to the interface, and has an impurity concentration that does not cause depletion in the off state. In addition, the first deep layer 15 has the concentration profile including a low-concentration region 15b on a side adjacent to the substrate 11 than the high-concentration region 15a. The low-concentration region 15b has a gradient of change in the impurity concentration along the Z-axis direction is smaller than a predetermined value, and is depleted in the off state. In other words, the first deep layer 15 has the concentration profile that has the low-concentration region 15b on a side adjacent to the substrate 11 than the high-concentration region 15a, and in which the low-concentration region 15b includes a region where the impurity concentration does not substantially change along the Z-axis direction, and is depleted in the off state. Note that, although a portion of the first deep layer 15 close to the substrate 11 has a large gradient of change in the impurity concentration, the portion is included in the low-concentration region 15b as being depleted.

The high-concentration peak has the impurity concentration higher than the maximum impurity concentration of the current spreading layer 17. The impurity concentration of the high-concentration peak is, for example, $1.0\times10^{18}/cm^3$ or higher. The current spreading layer 17 is configured, for example, so that the maximum impurity concentration is about $3.0\times10^{17}/cm^3$. In the low-concentration region 15b, the impurity concentration of the region where the gradient of change in impurity concentration along the Z-axis direction is less than a predetermined value (that is, the region where the impurity concentration is substantially constant) is approximately the same as the maximum impurity concentration of the current spreading layer 17, and is, for example, about $3.0\times10^{17}/cm^3$.

In the semiconductor substrate 10, as described above, the position (that is, the depth) of the interface is defined as the first position P1. Further, in the semiconductor substrate 10, the position of the high concentration peak is defined as a second position P2, and the position closest to the base layer 21 in the low-concentration region 15b is defined as a third position P3. In other words, the third position P3 can be said to be a boundary between the high-concentration region 15a and the low-concentration region 15b, or a position where the impurity concentration sharply increases from the low-concentration region 15b toward the high-concentration peak. Furthermore, the third position P3 can also be said to be an intersection point between a region where the gradient of change in impurity concentration is equal to or greater than the predetermined value and a region where the gradient is less than the predetermined value. Further, it can be said that the first deep layer 15 is formed to have the concentration profile that has the high-concentration region 15a between the first position P1 and the third position P3 and the low-concentration region 15b in a portion closer to the substrate 11 than the third position P3.

In the present embodiment, a first length L1 between the first position P1 and the second position P2 is shorter than a second length L2 between the second position P2 and the third position P3. In other words, since the high-concentration region 15a lies between the first position P1 and the third position P3, the second position P2 is located closer to the first position P1 than the center of the high-concentration region 15a in the Z-axis direction.

The configuration of the SiC semiconductor device of the present embodiment is described hereinabove. Next, operation and advantageous effects of the SiC semiconductor device will be described.

First, in the off state of the SiC semiconductor device before the gate electrode 27 is applied with the gate voltage being equal to or higher than the threshold voltage, an inversion layer is not formed in the base layer 21. For this reason, even if a positive voltage of, for example, 1600V is applied to the lower electrode 30, electrons do not flow into the base layer 21 from the source region 22. As such, the SiC semiconductor device is in the off state in which the current does not flow between the upper electrode 29 and the lower electrode 30.

When the SiC semiconductor device is in the off state, an electrical field is applied between the drain and the gate, and an electrical field concentration can occur at the bottom portion of the gate insulating film 26. However, in the SiC semiconductor device described above, the first deep layer 15 and the JFET portion 14 are provided at positions deeper than the trench 25. Also, the first deep layer 15 has the impurity concentration such that the high concentration peak is not depleted. Therefore, a depletion layer formed between the first deep layer 15 and the JFET portion 14 suppresses the rising of equipotential lines due to an influence of the drain voltage, and makes the high electric field difficult to enter the gate insulating film 26. In the present embodiment, therefore, breakage of the gate insulating film 26 can be suppressed.

The low-concentration region 15b in the first deep layer 15 has an impurity concentration that can cause the depletion. Therefore, when the SiC semiconductor device is in the off state, the portion of the first deep layer 15 including the low-concentration region 15b is also depleted. As such, the decrease in breakdown voltage of the SiC semiconductor device due to the formation of the first deep layer 15 can be suppressed.

In the present embodiment, the first length L1 is shorter than the second length L2. Therefore, as compared to a case where the first length L1 is equal to or greater than the second length L2 in the SiC semiconductor device having the same breakdown voltage, the length of the first deep layer 15 in the Z-axis direction can be reduced. As such, the increase in size of the SiC semiconductor device in the Z-axis direction can be suppressed.

When the gate electrode 27 is applied with the gate voltage, such as 20 V, that is higher than the threshold voltage, an inversion layer is formed on the surface of the base layer 21 that is in contact with the trench 25. As a result, a current is caused between the upper electrode 29 and the lower electrode 30, and the SiC semiconductor device is brought into an on state. In the present embodiment, since the electrons having passed through the inversion layer flow to the substrate 11 via the current spreading layer 17, the JFET portion 14 and the low-concentration layer 13, it can be said that the drift layer 19 is configured to include the current spreading layer 17, the JFET portion 14 and the low-concentration layer 13.

Next, a method for manufacturing the SiC semiconductor device according of the present embodiment will be described with reference to FIGS. 3A to 3G. FIGS. 3A to 3G are cross-sectional views defined along an XZ plane, that is, cross-sectional views having the normal direction along the Y-axis direction of FIG. 1.

Figure 3A:
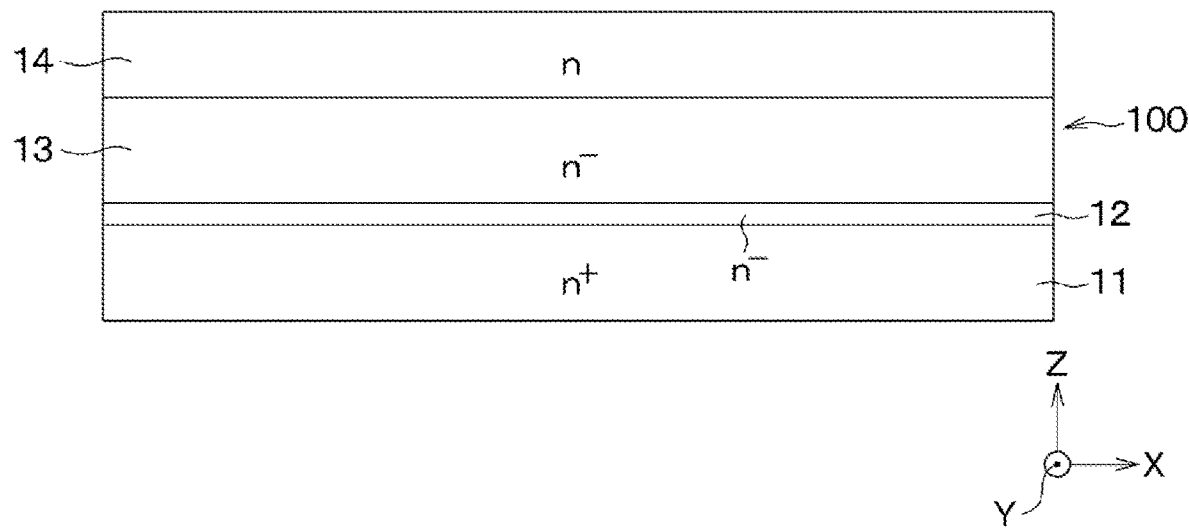
FIG. 3A is a cross-sectional view showing a manufacturing process of a SiC semiconductor device.

First, as shown in FIG. 3A, a constituent substrate 100 having a buffer layer 12, a low-concentration layer 13, and a JFET portion 14 on the surface of a substrate 11 is prepared. The buffer layer 12, the low-concentration layer 13 and the JFET portion 14 are made of SiC. In other words, the constituent substrate 100 including a part of the drift layer 19 on the substrate 11 side is prepared.

Figure 3B:
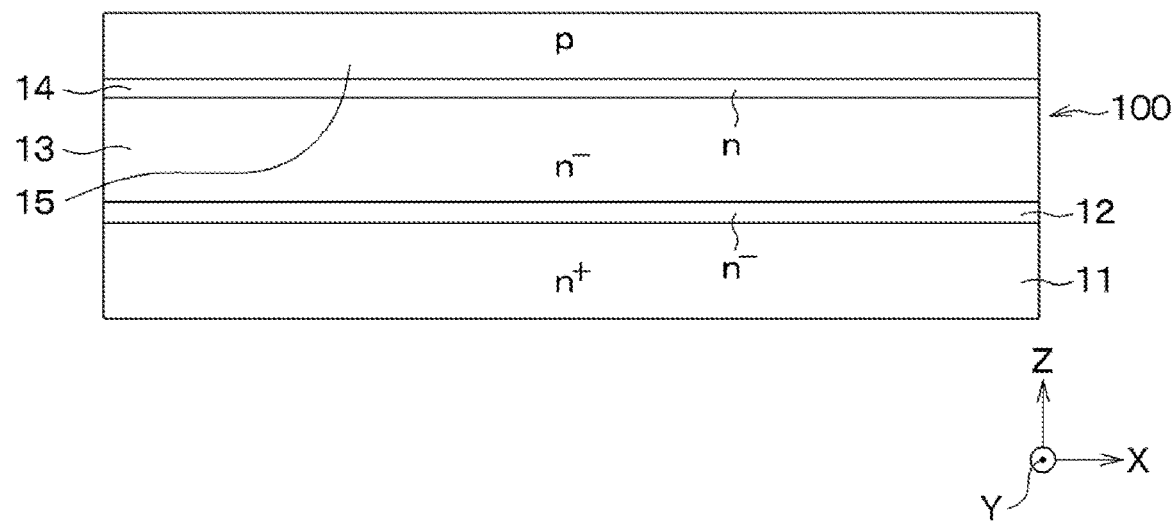
FIG. 3B is a cross-sectional view showing a manufacturing process of the SiC semiconductor device continued from the process shown in FIG. 3A.

Next, as shown in FIG. 3B, a first deep layer 15 is formed by performing an ion-implantation of a p-type impurity using a mask (not shown) on the constituent substrate 100. Specifically, by performing the ion-implantation multiple times while changing the acceleration energy, the first deep layer 15 having the concentration profile as shown in FIG. 2 is formed. That is, the first deep layer 15 having the concentration profile including the high-concentration region 15a and the low-concentration region 15b and in which the first length L1 is shorter than the second length L2 is formed.

Figure 3C:
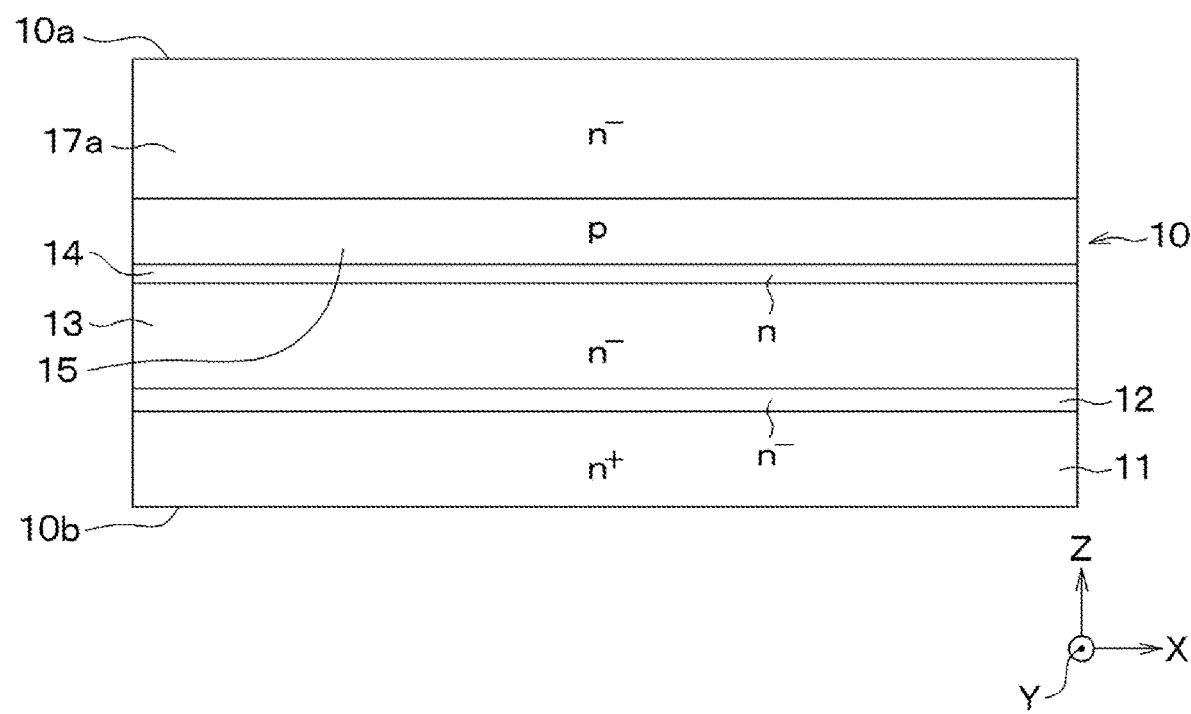
FIG. 3C is a cross-sectional view showing a manufacturing process of the SiC semiconductor device continued from the process shown in FIG. 3B.

Next, as shown in FIG. 3C, on the JFET section 14 and the first deep layer 15, a constituent layer 17a for forming the current spreading layer 17 and the like is epitaxially grown, thereby to form the semiconductor substrate 10. By arranging the constituent layer 17a after forming the first deep layer 15 in this way, it is possible to restrict the constituent layer 17a (that is, the current spreading layer 17) from being affected by the p-type impurity of the first deep layer 15. Therefore, it is possible to suppress a decrease in the effective concentration of the current spreading layer 17 when the current spreading layer 17 is formed, and it is thus possible to suppress an increase in the on-resistance.

Figure 3D:
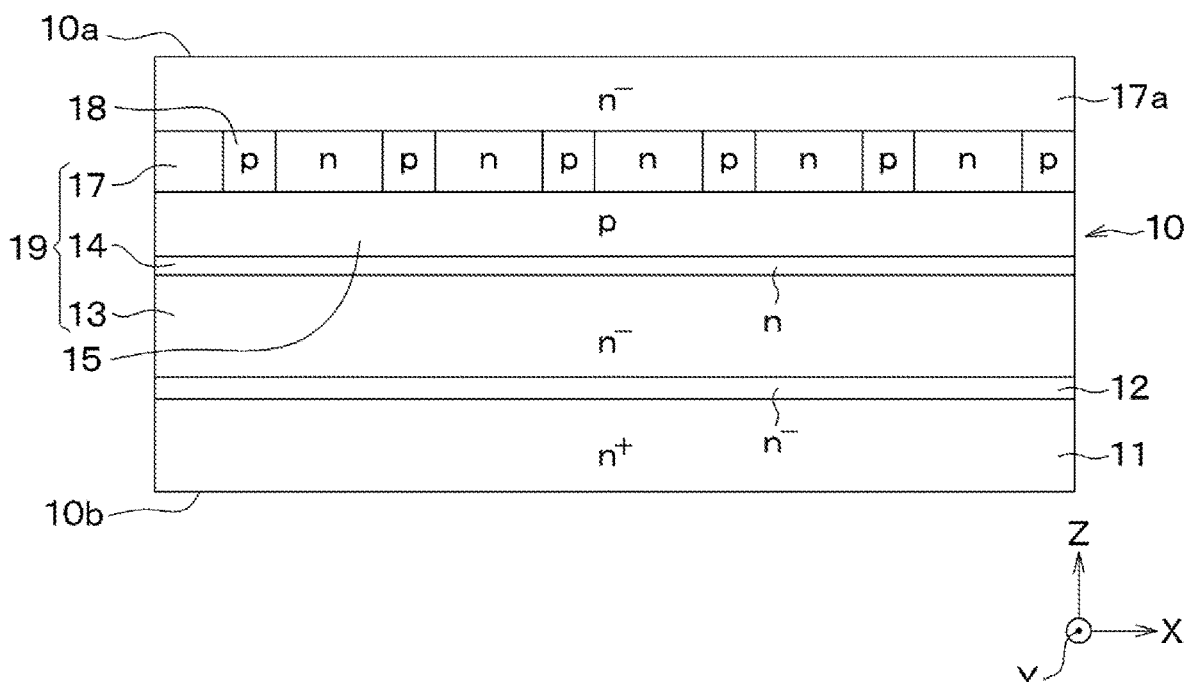
FIG. 3D is a cross-sectional view showing a manufacturing process of the SiC semiconductor device continued from the process shown in FIG. 3C.

Next, as shown in FIG. 3D, the current spreading layer 17 is formed by performing an ion-implantation of an n-type impurity using a mask (not shown) on the constituent layer 17a. Thus, the drift layer 19 is formed. That is, the impurity concentration of the portion that forms the interface with the first deep layer 15 is adjusted. Also, a second deep layer 18 is formed by performing an ion-implantation of a p-type impurity using a mask (not shown) on the constituent layer 17a.

Figure 3E:
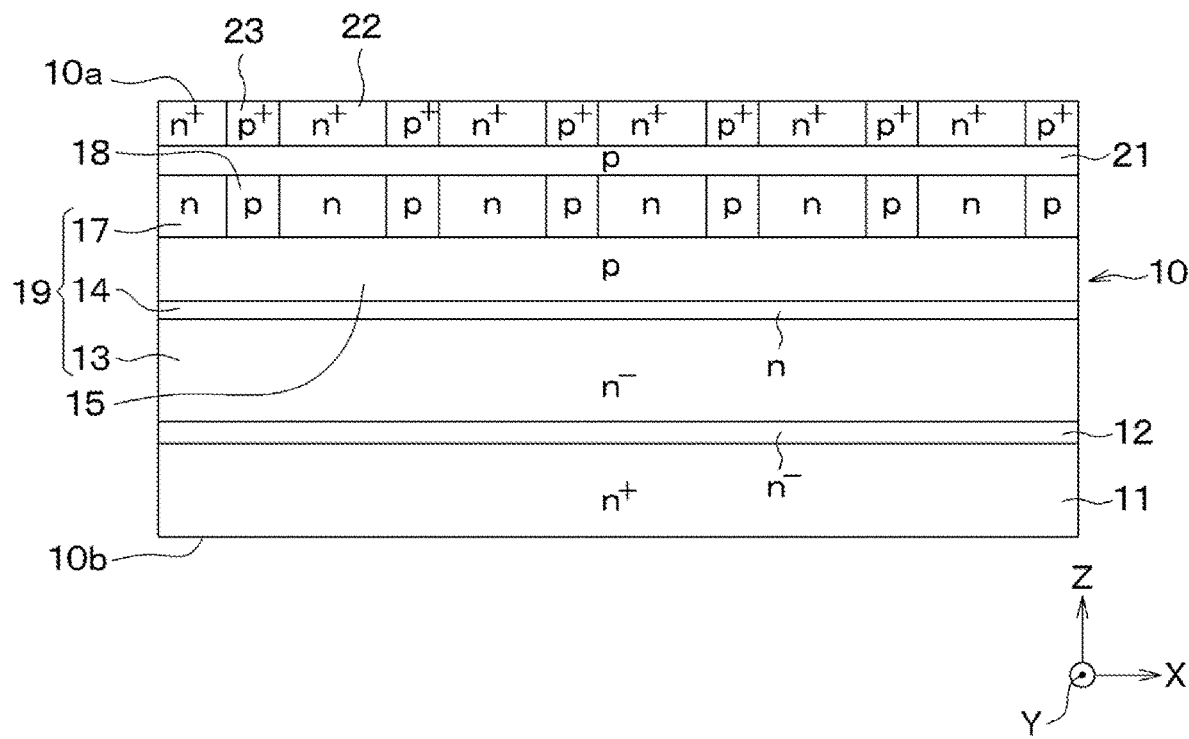
FIG. 3E is a cross-sectional view showing a manufacturing process of the SiC semiconductor device continued from the process shown in FIG. 3D.

Next, as shown in FIG. 3E, a base layer 21, a source region 22, and a contact region 23 are formed by appropriately performing an ion-implantation of an impurity again using a mask (not shown) on the constituent layer 17a.

Figure 3F:
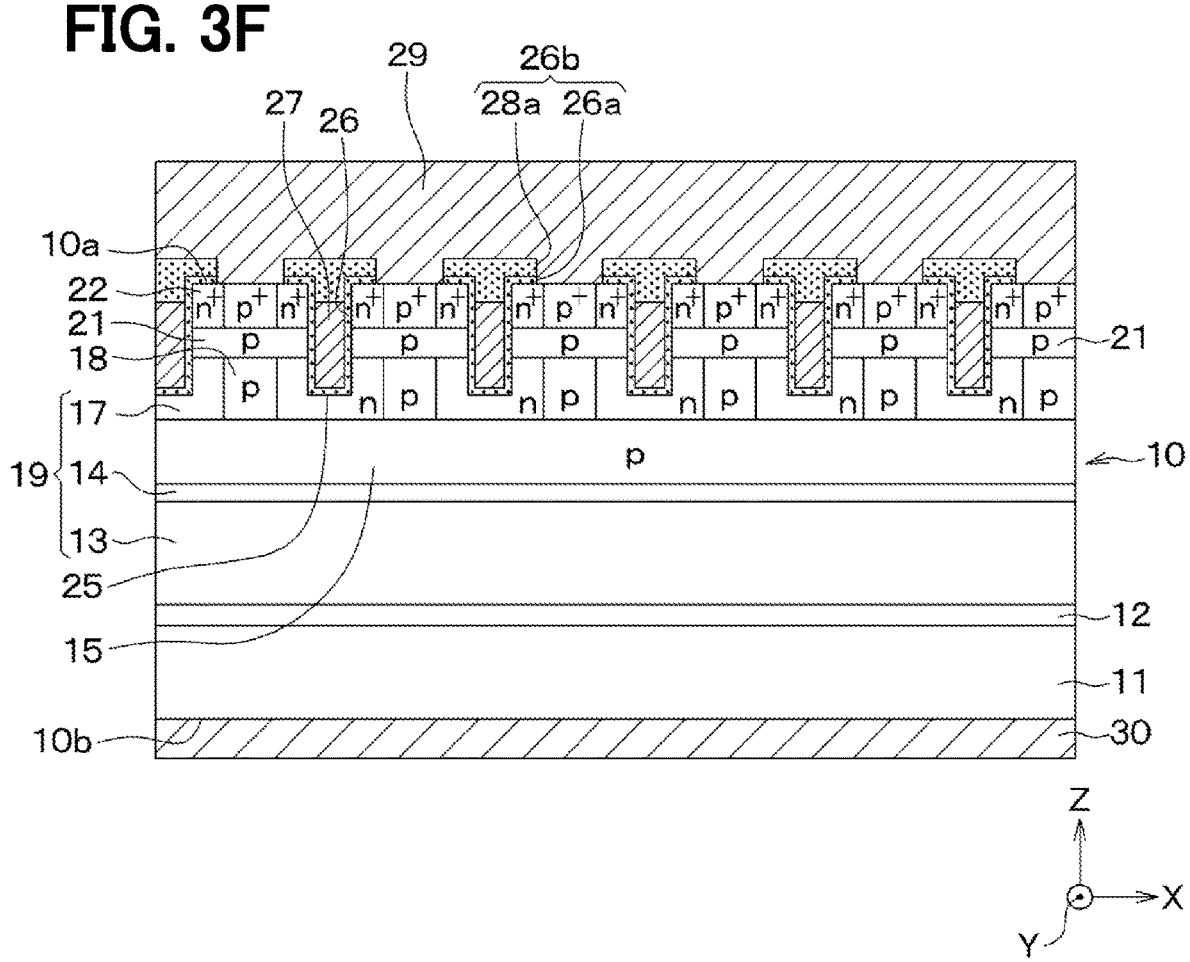
FIG. 3F is a cross-sectional view showing a manufacturing process of the SiC semiconductor device continued from the process shown in FIG. 3E.

Thereafter, as shown in FIG. 3F, a trench gate structure, an interlayer insulating film 28, an upper electrode 29, a lower electrode 30 and the like are formed by performing predetermined semiconductor manufacturing processes, although detailed description of the processes are omitted. In this way, the SiC semiconductor device of the present embodiment is produced.

In the present embodiment described above, the first deep layer 15 has the concentration profile including the high-concentration region 15a that has the high-concentration peak whose impurity concentration does not cause depletion in the off state, and the low-concentration region 15a whose impurity concentration causes depletion in the off state. As a result, it is possible to suppress breakage of the gate insulating film 26 while suppressing the decrease in breakdown voltage. Also, the first deep layer 15 is formed such that the first length L1 is shorter than the second length L2. Therefore, as compared to a case where the first length L1 is equal to or greater than the second length L2 in the SiC semiconductor device having the same breakdown voltage, the length of the first deep layer 15 in the Z-axis direction can be shortened. As such, it is possible to suppress the SiC semiconductor device from increasing in size in the Z-axis direction.

In the present embodiment, the semiconductor substrate 10 is formed by arranging the constituent layer 17a on the constituent substrate 100 after forming the first deep layer 15 in the constituent substrate 100. Therefore, it is possible to suppress the p-type impurity forming the first deep layer 15 from affecting on the constituent layer 17a (that is, the current spreading layer 17). As such, it is possible to suppress a decrease in the effective concentration of the current spreading layer 17 when the current spreading layer 17 is formed, and it is possible to suppress an increase in the on-resistance.

Modifications of First Embodiment

Figure 4A:
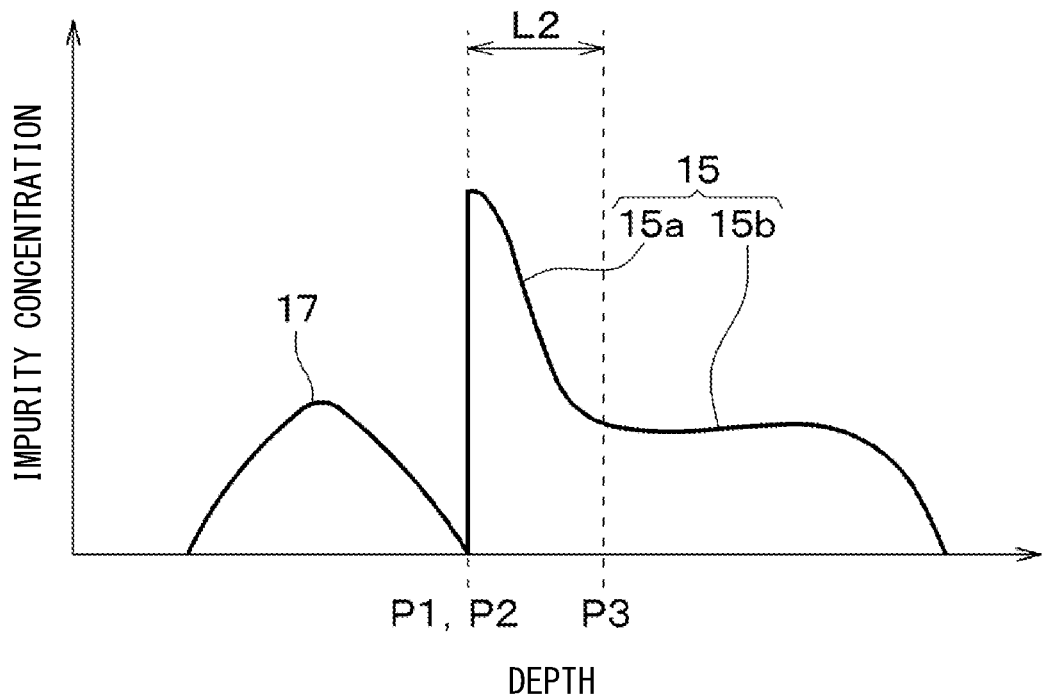
FIG. 4A is a schematic diagram showing a concentration profile of a current spreading layer and a first deep layer according to a modification of the first embodiment.
Figure 4B:
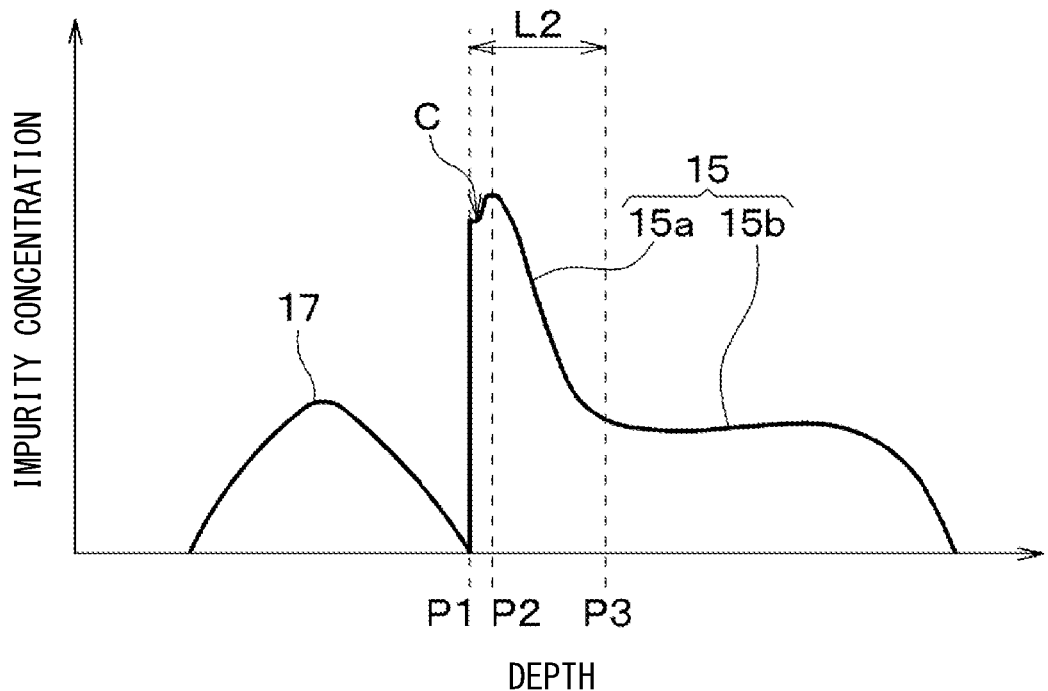
FIG. 4B is a schematic diagram showing a concentration profile of a current spreading layer and a first deep layer according to another modification of the first embodiment.

Modifications of the first embodiment will be described hereinafter. In the first embodiment described above, the specific shape of the concentration profile can be modified appropriately as long as the first deep layer 15 has the concentration profile in which the first length L1 is shorter than the second length L2. For example, as shown in FIG. 4A, the first deep layer 15 may have a concentration profile in which the second position P2 coincides with the first position P1 and the first length L1 is zero. As another example, as shown in FIG. 4B, the first deep layer 15 may have a concentration profile having a step C between the second position P2 and the first position P1.

Other Embodiments

Although the present disclosure has been described in accordance with the embodiments, it is understood that the present disclosure is not limited to such embodiments or structures. The present disclosure encompasses various modifications and variations within the scope of equivalents. Further, various combinations or forms as well as other combinations or forms including only one element, one or more elements, or one or fewer elements, fall within the scope or the spirit of the present disclosure.

For example, in the first embodiment described above, the MOSFET of the n-channel type trench gate structure in which the n-type is the first conductivity type and the p-type is the second conductivity type is described as an example of the semiconductor switching element. However, such a configuration is merely an example, and a semiconductor switching element of another structure, for example, a MOSFET of a trench gate structure of a p-channel type in which the conductivity type of each component is inverted with respect to the n-channel type may also be applicable. Further, other than the MOSFET, the semiconductor device may be formed with an IGBT with a similar structure. In the case of IGBT, the configurations are similar to those of the MOSFET of the first embodiment except that the n$^+$-type substrate 11 in the first embodiments is replaced by a p$^+$-type collector layer.

Further, in the first embodiment described above, the semiconductor substrate 10 is exemplarily made of SiC. However, the semiconductor substrate 10 may be configured using a silicon substrate, another compound semiconductor substrate, or the like.

Furthermore, although the first deep layer 15 extends along the X-axis direction in the first embodiment as an example, the first deep layer 15 may extend along the Y-axis direction.

In the first embodiment described above, the current spreading layer 17 is exemplarily formed by performing the ion-implantation after forming the constituent layer 17a. However, the current spreading layer 17 may be formed by arranging the constituent layer 17a while adjusting the impurity concentration, when the constituent layer 17a is arranged by epitaxial growth. That is, the current spreading layer 17 may be formed simultaneously with the step of arranging the constituent layer 17a, instead of the ion implantation.

Furthermore, in the first embodiment described above, the semiconductor substrate 10 may be formed by arranging the constituent layer 17a before forming the first deep layer 15, and then the first deep layer 15 may be formed by performing the ion-implantation to the semiconductor substrate 10.

What is claimed is:
1. A semiconductor device comprising:
   a drift layer of a first conductivity type;
   a base layer of a second conductivity type disposed on a surface layer portion of the drift layer;
   an impurity region of the first conductivity type disposed on a surface layer portion of the base layer, the impurity region having an impurity concentration higher than that of the drift layer;
   a trench gate structure including a gate insulating film disposed on a wall surface of a trench that penetrates the base layer and the impurity region and reaches the drift layer, and a gate electrode disposed on the gate insulating film;

a first deep layer of the second conductivity type disposed below the trench in the drift layer, and separated from the trench;

a second deep layer of the second conductivity type connecting the base layer and the first deep layer;

a high-concentration layer of the first conductivity type or the second conductivity type disposed opposite to the base layer with respect to the drift layer, the high-concentration layer having an impurity concentration higher than that of the drift layer;

a first electrode electrically connected to the base layer and the impurity region; and a second electrode electrically connected to the high-concentration layer, wherein the semiconductor device is configured to be in an on state so that a current occurs between the first electrode and the second electrode when the gate electrode is applied with a gate voltage being equal to or higher than a predetermined voltage, and to be in an off state when the gate electrode is applied with a gate voltage being lower than the predetermined voltage, the first deep layer has a high-concentration region and a low-concentration region in a concentration profile of an impurity concentration along a depth direction that corresponding to a stacking direction of the drift layer and the base layer, the high-concentration region has a high concentration peak at which the impurity concentration is maximum, and includes a region that is not depleted in the off state, the low-concentration region is disposed adjacent to the high-concentration layer than the high-concentration region, has a region in which a gradient of change in the impurity concentration is smaller than a predetermined value, and is depleted in the off state, a position closest to the base layer in the first deep layer is referred to as a first position, a position of the high concentration peak is referred to as a second position, a position closest to the base layer in the low-concentration region is referred to as a third position, the high-concentration region is disposed between the first position and the third position, and a first length between the first position and the second position is shorter than a second length between the second position and the third position.

2. The semiconductor device according to claim 1, wherein the drift layer includes a low-concentration layer, a junction field effect transistor (JFET) portion and a current spreading layer, the low-concentration layer is disposed adjacent to the high-concentration layer and has an impurity concentration lower than that of the high-concentration layer, the JFET portion is disposed on the low-concentration layer and has an impurity concentration higher than that of the low-concentration layer, the current spreading layer is disposed on the JFET portion, forms an interface with the base layer, and has an impurity concentration higher than that of the low-concentration layer, the JFET portion includes a plurality of linear portions extending in one direction, as a longitudinal direction, intersecting the depth direction, the first deep layer is disposed between the linear portions of the JFET portion, and the impurity concentration at the high concentration peak of the first deep layer is higher than a maximum impurity concentration of the current spreading layer, and the trench has a bottom surface in the current spreading portion.

3. The semiconductor device according to claim 1, wherein the high-concentration layer, the drift layer, the base layer, the impurity region, the first deep layer and the second deep layer provide a semiconductor substrate, and the semiconductor substrate is made of silicon carbide.

* * * * *